United States Patent [19]

Tani

[11] Patent Number: 5,273,928
[45] Date of Patent: Dec. 28, 1993

[54] METHOD OF MANUFACTURING SEMICONDUCTOR MEMORY DEVICE HAVING TRENCH CAPACITORS

[75] Inventor: Tomofune Tani, Tokyo, Japan

[73] Assignee: Nippon Steel Corporation, Tokyo, Japan

[21] Appl. No.: 953,980

[22] Filed: Sep. 30, 1992

[30] Foreign Application Priority Data

Oct. 4, 1991 [JP] Japan .................. 3-283902

[51] Int. Cl.⁵ .................................. H01L 21/70
[52] U.S. Cl. ........................... 437/52; 437/47; 437/60; 437/919
[58] Field of Search ............ 437/47, 48, 52, 60, 437/69, 233, 919; 257/303

[56] References Cited
FOREIGN PATENT DOCUMENTS

| 0287258 | 12/1986 | Japan .................. 257/303 |
| 2193034 | 1/1988 | United Kingdom .......... 437/69 |

OTHER PUBLICATIONS

"Process Interaction for 64M DRAM using an Asymmetrical Stacked Trench Capacitor (AST) Cell" IEDM 90 pp. 647-650.
"A 4.2 um² Half-Vcc Sheath Plate Capacitor DRAM Cell with Self-Aligned Buried Plate-Wiring" IEDM pp. 332-335.

Denshi Zairyo (Electronic Material) Jun. 1991, pp. 37-43.

*Primary Examiner*—Tom Thomas
*Attorney, Agent, or Firm*—Pollock, Vande Sande & Priddy

[57] ABSTRACT

A method of manufacturing a semiconductor memory device having trench capacitors comprises steps of, forming a trench in a semiconductor substrate, forming a first insulation film on a surface of the semiconductor substrate over at least a whole surface of inner walls of the trench, forming a resist layer within the trench having the surface formed with the first insulation film, the resist layer being destined for use as a mask for etching, removing selectively a portion of the first insulation film by etching by using the resist layer as a mask for the etching, removing the resist layer from the interior of the trench and forming a semiconductor film of a predetermined thickness over the surface of the semiconductor substrate and the side wall surfaces of the trench from which the first insulation film has been removed, oxidating selectively a portion of the semiconductor film, and forming a second insulation film for element isolation in continuation to the first insulation film while allowing other portion of the semiconductor film within the trench which has not undergone the selective oxidation to be left as a lower electrode of the trench capacitor.

6 Claims, 7 Drawing Sheets

METHOD OF MANUFACTURING SEMICONDUCTOR MEMORY DEVICE HAVING TRENCH CAPACITORS

BACKGROUND OF THE INVENTION

The present invention relates generally to a method of manufacturing a semiconductor memory device having trench capacitors. More particularly, the invention is concerned with a method of manufacturing a semiconductor memory device which includes trench capacitors and which is profitably suited for use as a dynamic random access memory or DRAM in abbreviation.

Figure 9:
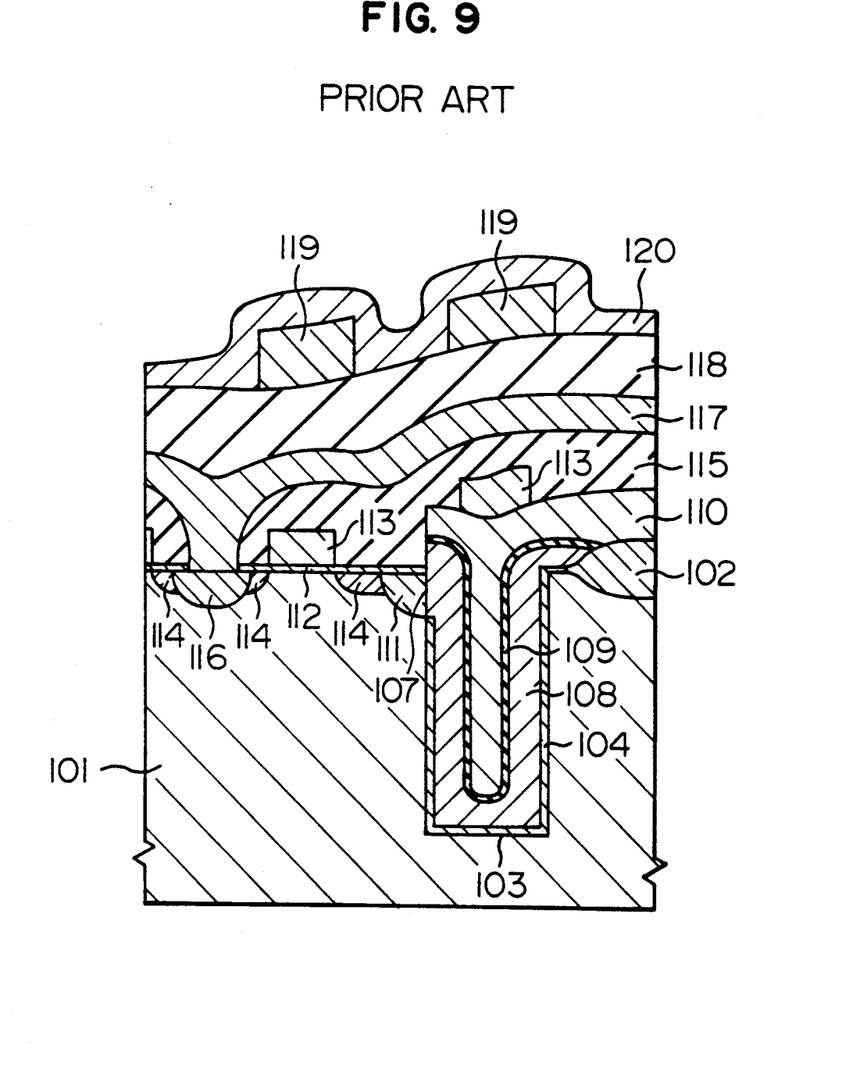
FIG. 9 is a sectional view of a semiconductor memory device manufactured by a prior art method.
Figure 10:
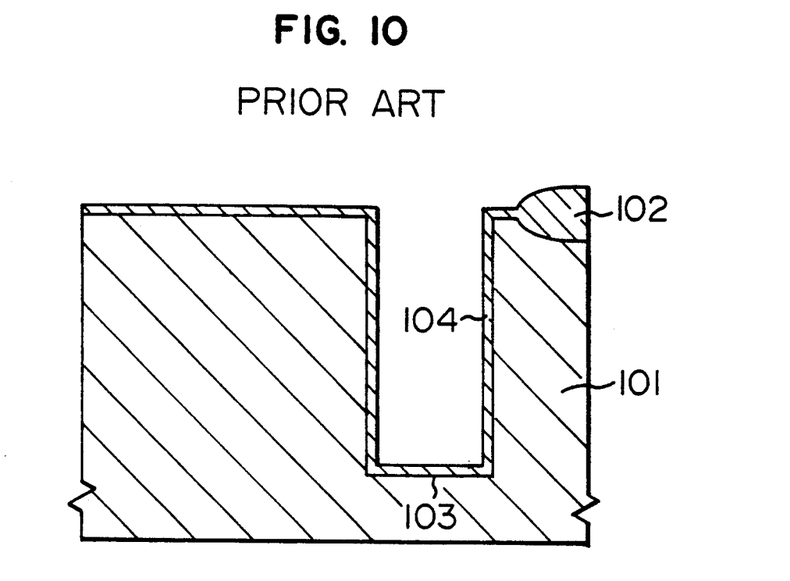
FIGS. 10 and 11 are views for illustrating steps of a semiconductor memory device manufacturing method known heretofore.
Figure 11:
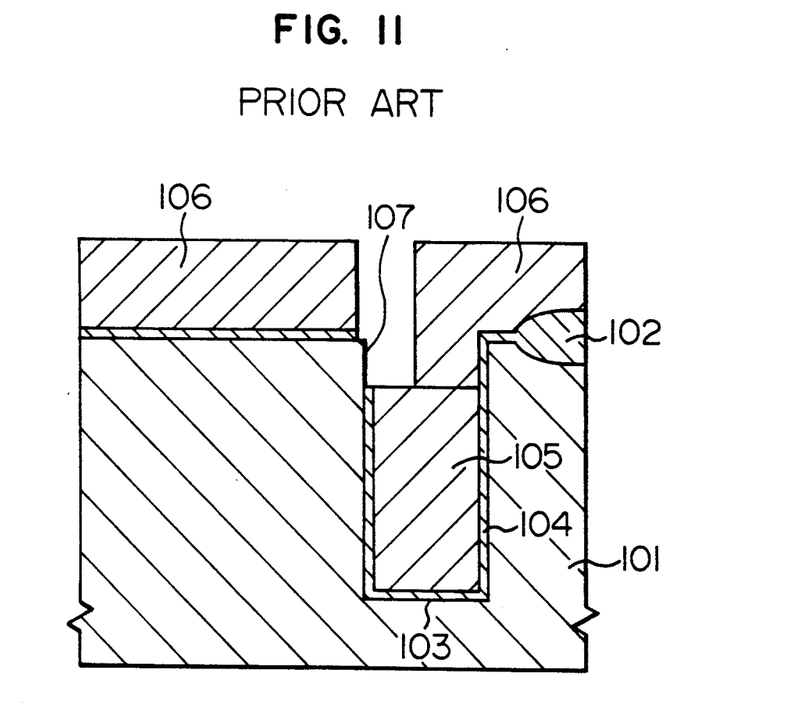

Heretofore, the DRAM in which stacked trench capacitors are employed has been manufactured by a method shown in FIGS. 9 to 11 of the accompanying drawings, as is disclosed, for example, in "Process Interaction for 64M DRAM using An Asymmetrical Stacked Trench Capacitor (AST) Cell" IEDM 90, pp. 647–650, "A 4.2 $\mu m^2$ Half-Vcc Sheath-Plate Capacitor DRAM Cell with Self-Aligned Buried Plate-Wiring" IEDM, pp. 232–335, and "Denshi Zairyo", (Electronic Material) June 1991, pp. 37–43.

This prior art manufacturing method will first be described. Referring to FIG. 10 of the accompanying drawings, there is first formed over a surface of a monocrystalline silicon substrate 101 an element isolating insulation film 102 by a LOCOS (Local Oxidation Of Silicon) method. Thereafter, a trench 103 is formed in the silicon substrate 101, for example, by a RIE Reactive Ion Etching) method. Subsequently, an insulation film 104 is formed over the whole surface of the silicon substrate 101 inclusive of inner wall surfaces of the trench 103 by a thermal oxidation method or a CVD (Chemical Vapor Deposition) method. This insulation film 104 serves for electrically isolating from the silicon substrate 101 the capacitor electrode which is formed within the trench 103 later on and serves at the same time for preventing occurrence of current leakage between the adjacent trenches, a so-called soft error and the like.

Subsequently, the trench 103 is filled or buried with a resist material or silicon 105 to an intermediate level in depth, whereupon a resist layer 106 is deposited in such a pattern that only a part of the opening of the trench 103 is exposed, as is illustrated in FIG. 11. By using the resist or silicon layer 105 and the resist layer 106 as a mask, a portion of the insulating film 104 is removed by etching to thereby expose a contact area 107 to be used for contacting a storage node of a capacitor and the silicon substrate 101 to each other.

Next, referring to FIG. 9, after removal of the resist layer 106 and the resist or silicon layer 105 (or at least a part thereof), a storage node 108, a capacitor insulation film 109 and a cell plate 110 are formed successively within the trench 103 to thereby realize a stacked trench capacitor. Subsequently, a gate oxidation film 112 is formed on the silicon substrate 101, for example, by a thermal oxidation method and then a diffused layer 111 is formed in the silicon substrate 101 for realizing contact with the storage node 108 of the stacked trench capacitor.

In succession, there are formed a gate electrode 113, diffused layers 114 serving as source and drain regions of a transistor, an inter-layer insulation film 115 and a diffused layer 116 for making contact with a bit line, respectively. Additionally, wiring conductors 119 for the bit line 117, an inter-layer insulation film 118 and a gate electrode 113, respectively, are formed. Finally, a passivation film 120 is formed over the whole surface.

As is apparent from the above description, the prior art semiconductor memory manufacturing method is disadvantageous in that the process is very complicated because there are required two layers of the etching masks 105 and 106 for forming the contact area 107 and additionally the patterning process for patterning the resist layer 106.

Further, difficulty is encountered in patterning the resist layer 106 in a desired shape with a satisfactory accuracy because of possibility of misalignment of an illumination unit and/or insufficient exposure due to presence of offset in the substrate, as a result of which it has been very difficult to realize the contact area 107, involving eventually difficulty in manufacturing the DRAM as a whole with a stable yield. Besides, because a margin is required for the mask alignment upon patterning of the resist layer 106, the hitherto known method is not suited for the manufacture of the DRAM of high integration and high density.

Additionally, it is noted that in the case of the known manufacturing method described above, the trench 103 is formed after deposition of the element isolating insulation film 102 through the LOCOS method. Consequently, tolerance or margin must be taken into account in the design by considering the misalignment between the masks used in the various process steps and the illuminating unit and unevenness in the length of bird's-beak of the insulation film 102. For these reasons, implementation of the DRAM in high integration and high density has been difficult

SUMMARY OF THE INVENTION

It is therefore an object of the present invention to provide a method of manufacturing a semiconductor memory device having trench capacitors, which method is capable of forming the aforementioned contact area in a convenient manner with a stable yield and thus capable of manufacturing easily a semiconductor memory device of high integration and high density.

In view of the above object, there is provided according to an aspect of the present invention a method of manufacturing a semiconductor device having trench capacitors, which method comprises a step of forming a trench in a semiconductor substrate, a step of forming a first insulation film at least over a whole surface of inner walls of the trench, a step of forming an etching mask material internally of the trench having the first insulation layer formed thereon, a step of etching away a portion of the first insulating film by using the mask layer as an etching mask, a step of forming a semiconductor film having a predetermined film thickness on the semiconductor substrate and within the trench, and a step of forming a second element isolating insulation film in continuation to the first insulation film while allowing the semiconductor film within the trench to remain as a lower electrode of a trench capacitor.

In a preferred mode for carrying out the present invention, the mask layer is so formed as to bury the trench with the mask material to a predetermined level in depth, whereon the first insulation film overlying the mask layer is removed by the etching.

In the method of manufacturing the semiconductor memory device according to the present invention, the contact for realizing electric connection or contact between the lower electrode of a capacitor formed within the trench and a drain region formed in the semiconductor substrate is formed by using the etching mask formed internally of the trench in the insulation film which is deposited over the inner surface of the trench for the purpose of preventing a current leakage from the capacitor to the semiconductor substrate as well as soft error. Accordingly, there is no necessity of using the mask layer which requires the mask alignment as described above in conjunction with the prior art method, whereby the margin for the mask alignment is no more of concern.

Besides, in the case of the method of manufacturing a semiconductor memory device according to the present invention, the margin for the mask alignment matching between the element isolating insulation film and the trench is no more required because both the element isolating insulation film and the lower electrode of the capacitor implemented internally of the trench is formed of one and the same semiconductor film.

DESCRIPTION OF THE PREFERRED EMBODIMENTS

Now, a method of manufacturing a DRAM according to an embodiment of the present invention will be described in detail by reference to FIGS. 2 to 8.

Figure 2:
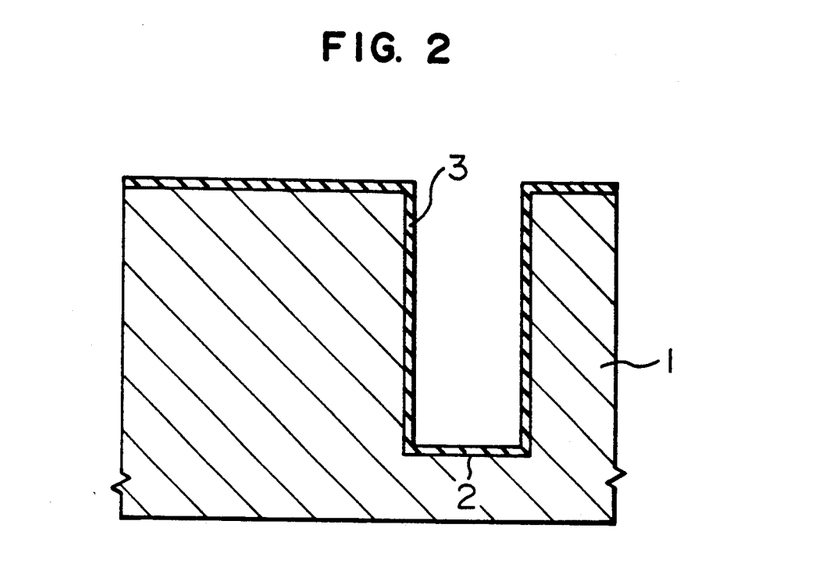
FIGS. 2 to 8 are views for illustrating processes or steps involved in a semiconductor memory device manufacturing method according to an embodiment of the invention.

Referring to FIG. 2, a trench 2 for realizing a capacitor is formed in a monocrystalline silicon substrate (Si-substrate) 1 by a RIE (Reactive Ion Etching) method. Subsequently, an $SiO_2$-insulation film 3 having a thickness in a range from ca. 10 to 50 nm is deposited over a whole surface of the Si-substrate 1 inclusive of the inner surface of the trench 2 by a thermal oxidation method or a CVD (Chemical Vapor Deposition) method.

Figure 3:
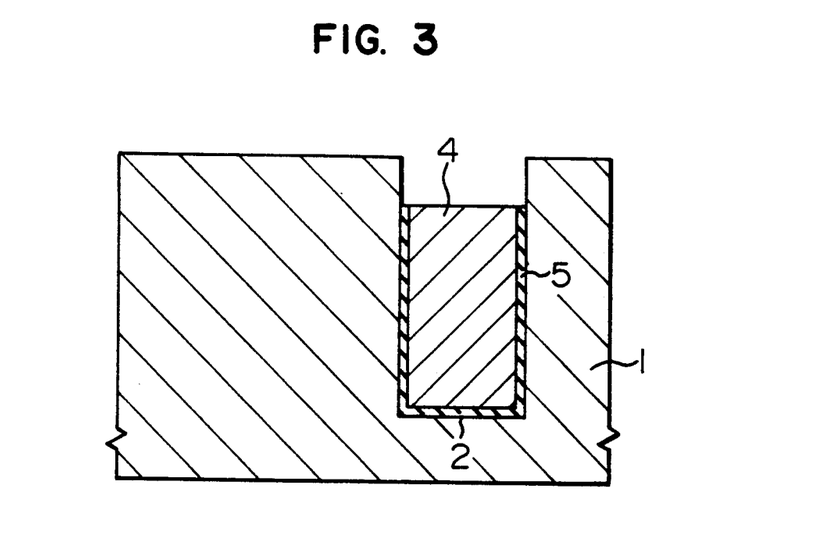

Next, the trench 2 is buried with a resist material 4 to a predetermined level in depth, and the insulation film 3 is etched by using the resist layer 4 as a mask so as to allow an insulation film 5 to be left. Parenthetically, a polycrystalline silicon film may be used in place of the resist layer 4 to the substantially same effect.

Figure 4:
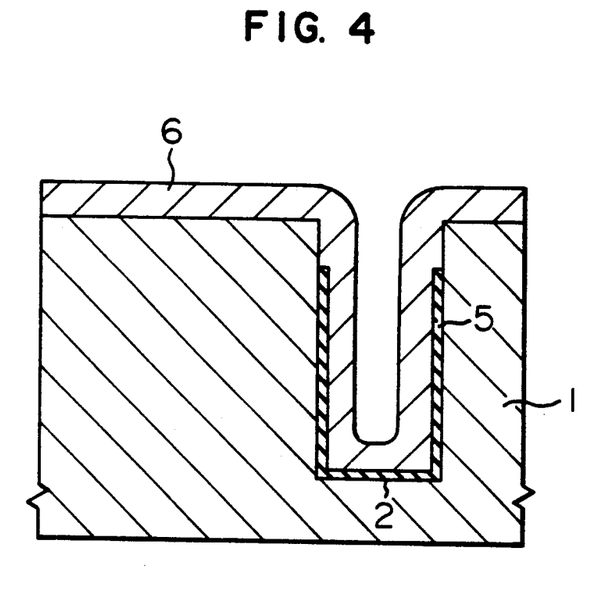

After having removed the resist layer 4, a polycrystalline silicon film 6 of ca. 10 to 100 nm in thickness is deposited over the whole surface by a CVD or the like method, as is shown in FIG. 4.

Figure 5:
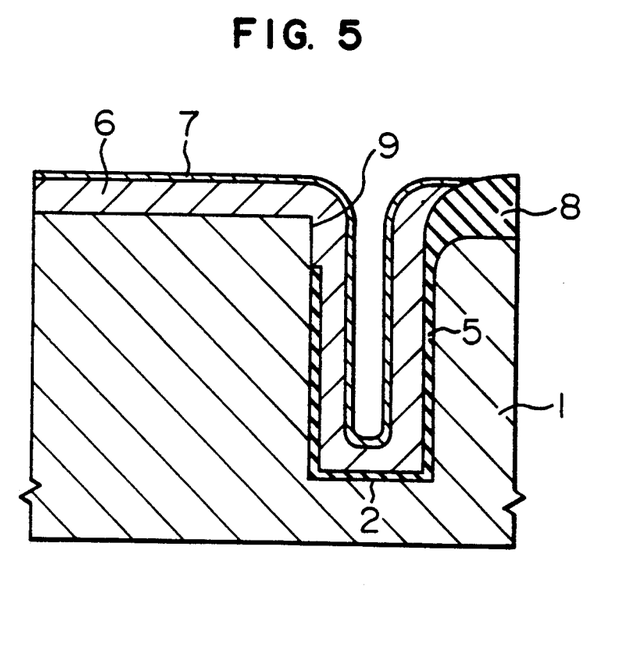

Subsequently, an SiN insulation film 7 is deposited over the whole surface by a CVD or the like method, and then patterning of the insulation film 7 is performed in such a manner that a portion of the insulation film overlying an element active region is left. As a result, the insulation film 7 of a shape shown in FIG. 5 is formed. By using this insulation film 7 as an oxidation-resistant mask, a portion of the polysilicon film 6 is thermally oxidized to thereby form an element isolating insulation film 8. At that time, the insulation films 5 and 8 are formed to be integral with each other except for a region in which a contact area 9 is to be formed for making contact between the silicon substrate 1 and the polycrystalline silicon film 6.

In this conjunction, it is noted that when the polysilicon film 6 is thermally oxidized in the manner described above, oxygen is consumed for the oxidation of the polycrystalline silicon film 6, whereby diffusion of oxygen in the lateral direction is suppressed. As a consequence, when compared with the thermal oxidation of the monocrystalline silicon substrate as in the case of the conventional LOCOS method, a bird's beak making appearance in the insulation film 8 is diminished, which is advantageous or favorable for implementation of the device with high integration and high density.

Figure 6:
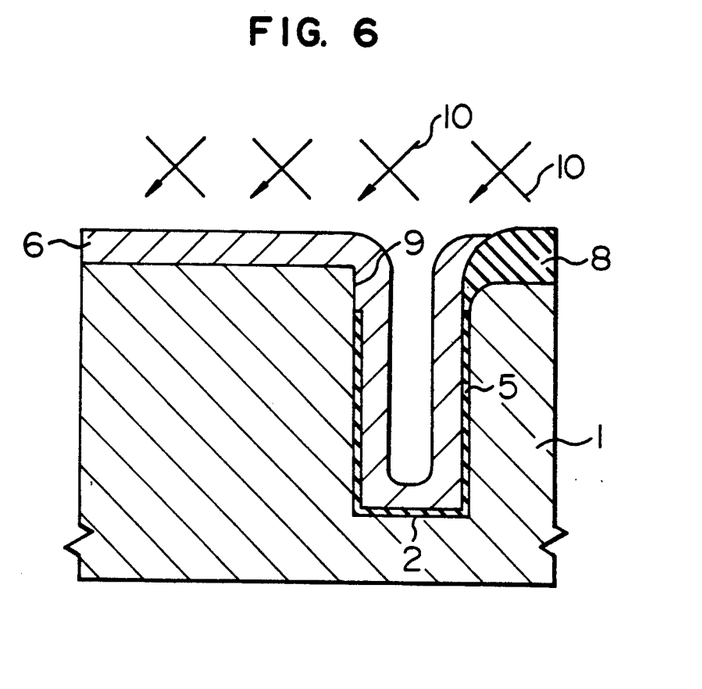

Subsequently, the insulation film 7 is removed by etching or the like process, and then impurity 10 is diffused into the polycrystalline silicon film 6 in a dose ranging from ca. $1 \times 10^{14}$ to ca. $1 \times 10^{16}/cm^2$, as is shown in FIG. 6. At that time, because of presence of a recess in the polycrystalline silicon film 6 due to the trench 2, impurity 10 will possibly be introduced into side walls and a bottom wall of the recess. To evade such possibility, an oblique ion implantation should preferably be adopted in which ions are implanted in the direction inclined about 45° at maximum relative to the silicon substrate 1.

Figure 7:
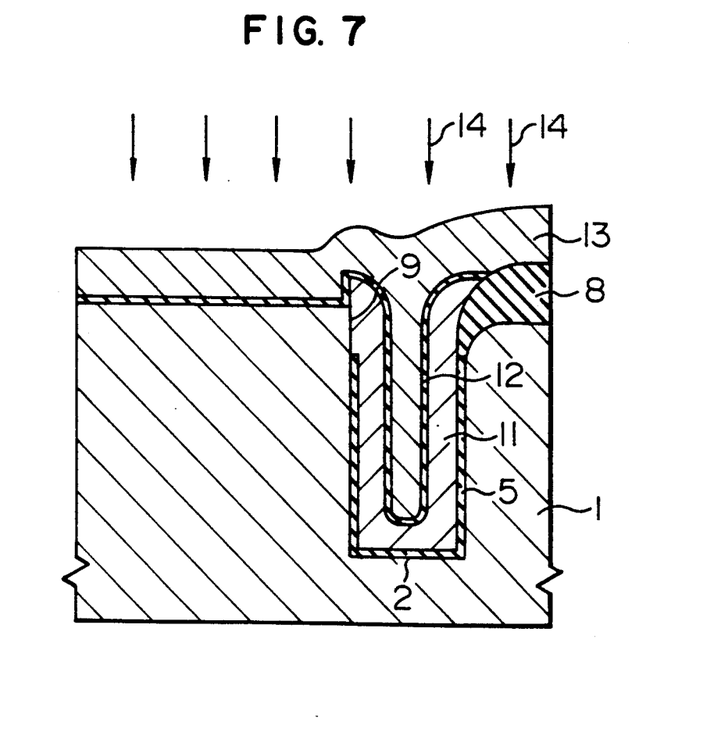

Next, patterning of the polycrystalline silicon film 6 is performed such that the polycrystalline silicon film 6 remains only within the trench 2 to thereby form a storage node (lower electrode) 11 of the capacitor, and then an insulation film 12 is formed over the whole surface by a CVD or the like process. As the insulation film 12, there may be used a $SiO_2$-film, an ONO-film composed of a $SiO_2$-film, SiN-film and a $SiO_2$-film or alternatively a film of oxidized tantalum or the like.

Subsequently, a polycrystalline Si-film 13 is formed over a whole surface by a CVD or the like method, and impurity 14 is introduced into the polycrystalline Si-film 13 through an ion implantation or the like process in a dose ranging from ca. $1 \times 10^{14}$ to $1 \times 10^{16}/cm^2$.

Figure 8:
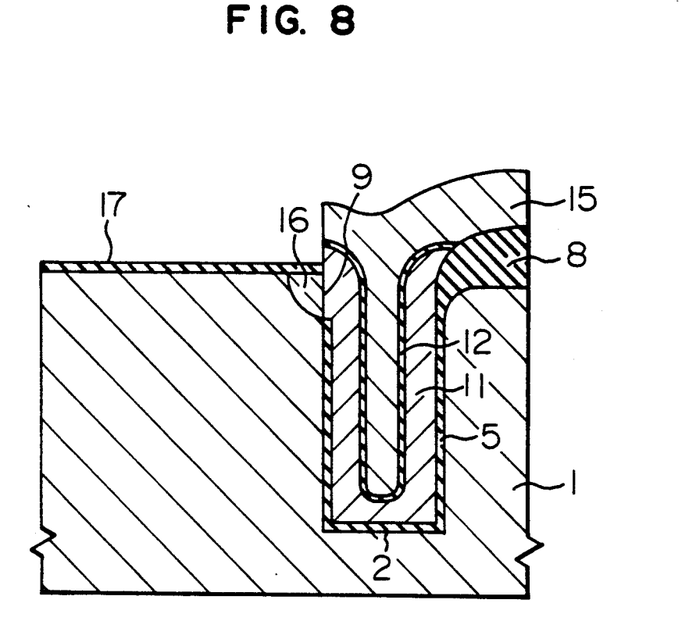

Next, patterning of the polycrystalline Si-film 13 and the insulation film 12 is carried out to thereby realize a capacitor cell plate 15 and a capacitor insulation film 12 while allowing a portion of the element-active region on the Si-substrate 1 except for the trench 2 to be exposed. Thus, the stacked trench capacitor according to the instant embodiment is constituted by the storage node 11, the capacitor insulation film 12 and the cell plate 15.

Thereafter, a gate insulation film 17 having a thickness in a range of ca. 5 to 50 nm is formed on the exposed surface of the Si-substrate 1 by a CVD method or thermal oxidation method. As the gate insulation film 17, there can be used a $SiO_2$-film, SiN-film or the like.

In the meanwhile, there is formed in a region of the Si-substrate 1 which is contacted to the storage node 11 through the contact 9 a diffusion layer 16 of a conductivity type opposite to that of the Si-substrate 1 by the impurity diffused in solid phase into the Si-substrate 1 from the storage node 11.

Figure 1:
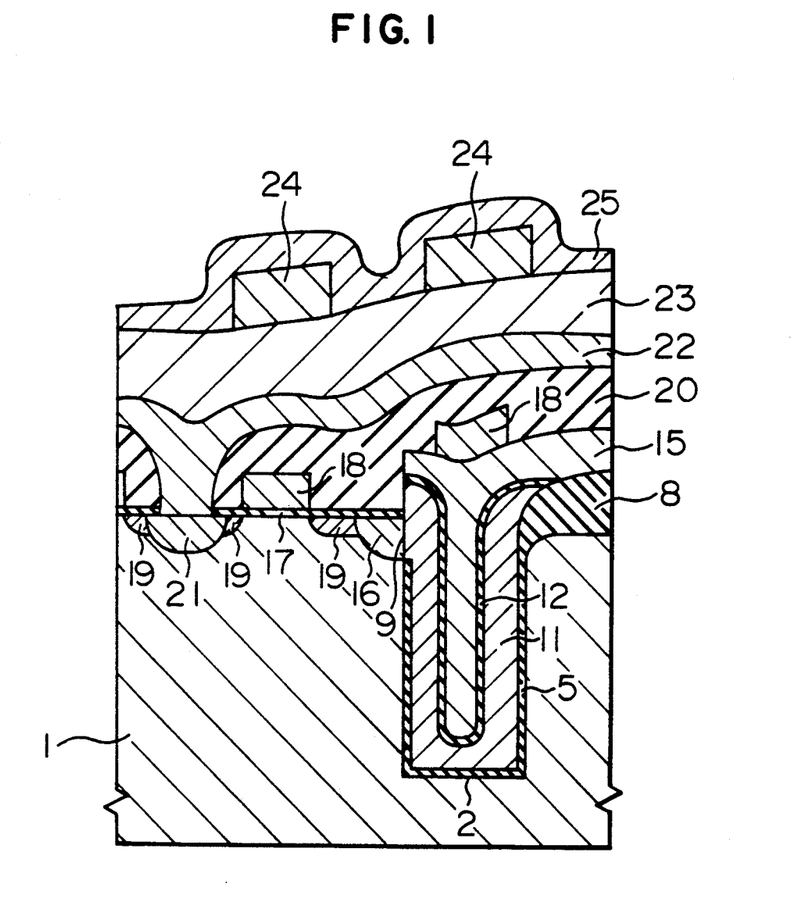
FIG. 1 is a sectional view showing a semiconductor memory device manufactured by a manufacturing method according to an embodiment of the invention.

Next, a gate electrode 18 and diffusion layers 19 constituting source and drain regions of the transistor are formed sequentially by the methods known par se, as is shown in FIG. 1, to thereby realize a transistor. Thereafter, a diffusion layer 21 for contacting the inter-layer insulation film of $SiO_2$ 20 and the bit line conductor is formed by introducing impurity such as As in the Si-substrate by an ion implantation method.

Additionally, bit conductors 22 of conductive material such as polysilicon, polyside, Al-Si-Cu or the like, an inter-layer insulation film 23 such as a SiO$_2$-film containing B and P (BPSG film) and a wiring conductor 24 of Al-Si-Cu for the gate electrode 18 are formed, respectively. Finally, a passivation film 25 is formed. Thus, there is implemented a DRAM.

As will be appreciated from the foregoing description, in the stacked trench capacitor manufactured by the method according to the illustrative embodiment of the invention, the contact 9 formed on a side wall of the trench can be realized without using the photolithography process, which means that the contact 9 can be formed in a very convenient manner steadily with a high yield. Furthermore, since the element isolating insulation film 8 and the lower electrode 11 of the capacitor can be formed of one and the same polycrystalline Si-film 6, there arises no problem of the mask misalignment mentioned hereinbefore. Besides, because the bird's beak can be diminished, a design margin between the element isolating insulation film 8 and the capacitor-dedicated trench can be reduced, favorably to a high density integration of the device.

According to the semiconductor memory device manufacturing method of the invention, the contact between the substrate and the capacitor electrode provided in a side wall of the trench forming a capacitor can be formed in a convenient and table manner. Further, the element isolating insulation film and the lower electrode of the capacitor can be formed of one and the same semiconductor film. By virtue of these features, the margin between the element isolating insulation film and the trench to be taken into account in the design can be reduced, whereby the semiconductor memory device can be realized with high integration and high density.

I claim:

1. A method of manufacturing a semiconductor memory device having trench capacitors, comprising the steps of:

forming a trench in a semiconductor substrate;

forming a first insulation film on a surface of said semiconductor substrate over at least a whole surface of inner walls of said trench;

forming a layer of a resist material within said trench to a selected depth of said trench, said layer being destined for use as a mask for etching;

removing selectively a portion of said first insulation film by etching by using said resist layer as a mask for the etching;

removing said resist layer from the interior of said trench and forming a semiconductor film of a selected thickness over the surface of said semiconductor substrate and the side wall surfaces of said trench from which said first insulation film has been removed;

oxidizing selectively a portion of said semiconductor film to thereby form a second insulation film for element isolation integrally with said first insulation film in said trench and removing selectively other portion of said semiconductor film which has not undergone said selective oxidation so as to retain a part thereof within said trench as a lower electrode of the trench capacitor.

2. A semiconductor memory device manufacturing method according to claim 1, wherein said resist layer is formed by filling said trench with a resist material to said selected depth of said trench and a portion of said first insulating film which is not covered by the resist layer in the trench is wholly removed by the etching in the step of removing selectively.

3. A semiconductor memory device manufacturing method according to claim 1, wherein said second insulation film is formed integrally with said first insulation film.

4. A semiconductor memory device manufacturing method according to claim 1, wherein said step of removing selectively a portion of said semiconductor film which has not undergone the selective oxidation includes a step of forming a third insulation film on said semiconductor film in a region other than the region where said second insulation film is to be formed, a step of selectively oxidizing said semiconductor film by using said third insulation film as an oxidation-resistant mask, a step of removing said third insulation film after said selective oxidation, a step of introducing an impurity into said semiconductor film through ion implantation, and a step of removing said semiconductor film implanted with the impurity except for a region thereof to be left as said trench capacitor.

5. A semiconductor memory device manufacturing method according to claim 1, wherein the selective oxidization of said semiconductor film is carried out until said second insulation film as formed becomes integral with an end portion of said first insulating film.

6. A semiconductor memory device manufacturing method according to claim 2, wherein the selective oxidization of said semiconductor film is carried out until said second insulation film as formed becomes integral with an end portion of said first insulating film.

* * * * *